United States Patent [19]

Itoh et al.

[11] Patent Number: 4,590,588
[45] Date of Patent: May 20, 1986

[54] MONOLITHIC SEMICONDUCTOR MEMORY

[75] Inventors: Kiyoo Itoh, Higashikurume; Ryoichi Hori, Tokyo, both of Japan

[73] Assignee: Hitachi, Ltd., Tokyo, Japan

[21] Appl. No.: 515,519

[22] Filed: Jul. 20, 1983

[30] Foreign Application Priority Data

Jul. 21, 1982 [JP] Japan .............................. 57-125687
Jan. 17, 1983 [JP] Japan .................................. 58-4162

[51] Int. Cl.[4] .............................................. G11C 5/02
[52] U.S. Cl. ........................................ 365/51; 365/189
[58] Field of Search ................. 365/51, 63, 189, 230

[56] References Cited

U.S. PATENT DOCUMENTS 4,357,685 11/1982 Daniele et al. ..................... 365/189
4,367,540 1/1983 Shimohigashi ................. 365/189 X

*Primary Examiner*—Joseph A. Popek
*Attorney, Agent, or Firm*—Antonelli, Terry & Wands

[57] ABSTRACT

A semiconductor memory is disclosed having data lines divided lengthwise, which data lines cross word lines in a memory cell array and are selectively coupled to memory cells. A plurality of second data lines are arranged, one for each of predetermined groups of the data lines, to exchange data through first switches. Also one or more third data lines are arranged orthogonally to the second data lines to exchange data with the second data lines through second switches. Read/write controllers are coupled to the third data lines. Data is read and written for desired memory cells by selective drive of the word lines and the first and second switches.

11 Claims, 15 Drawing Figures

FIG. 3
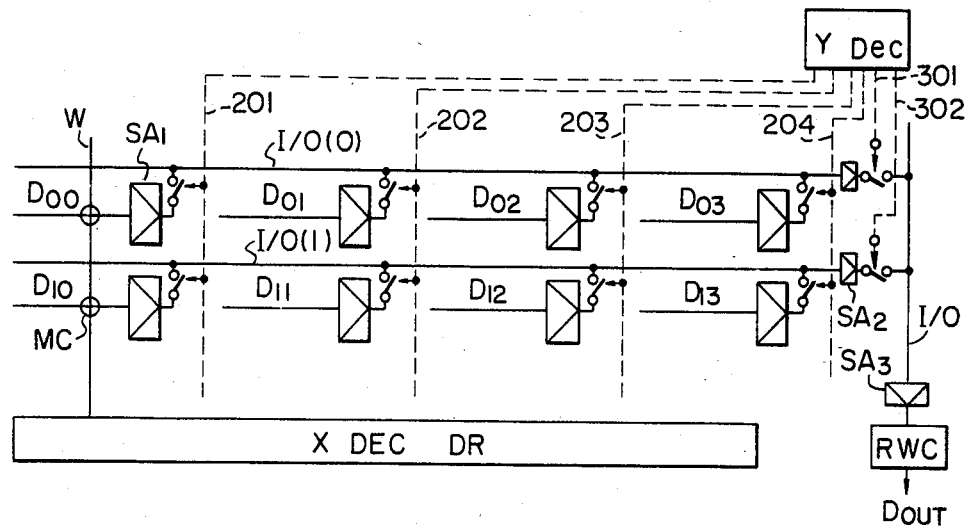
FIG. 4
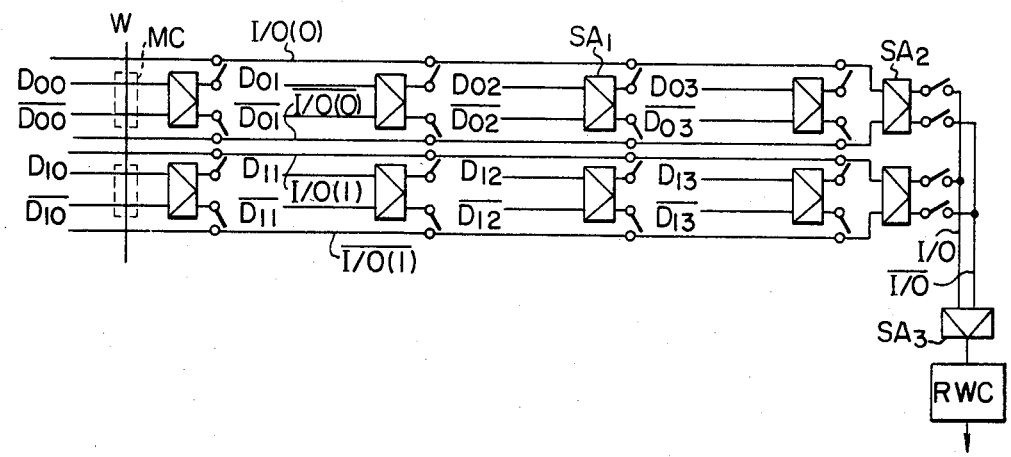
FIG. 5   FIG. 6   FIG. 7
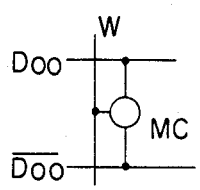 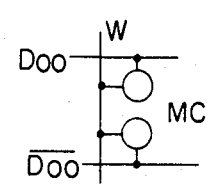 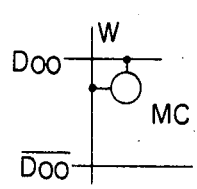

MONOLITHIC SEMICONDUCTOR MEMORY

The present invention relates to a semiconductor memory, and more particularly to a structure of data lines of such a semiconductor memory.

In the field of semiconductor memories, high integration density and high memories capacity memory have been developed as fine manufacturing techniques have been advanced. However, many problems are encountered in attaining a high integration density, high operation speed and high reliability memory. For example, in a MOS dynamic memory, a storage capacity of each memory cell decreases as the integration density of the memory increases. On the other hand, a capacitance and a length of each of data lines through which signals of the memory cells are read increase. As a result, a signal excursion in the data line is very small and hence it is very difficult to read the signal at a high speed with a high S/N (signal-to-noise) ratio.

In order to resolve the above problem, a plurality of memory arrays of the conventional structure may be arranged on a chip to shorten the length of the data lines of the respective memory arrays. However, a total space required for a peripheral circuit such as a decoder for connecting the respective memory arrays increases. This is contrary to the purpose of the high integration density.

In U.S. Pat. Application Ser. No. 380,409 (filed on May 20, 1982, now abandoned, by the same inventors as those of the present application), a first data line is divided lengthwise into a plurality of sub-lines which are connected to a second data line arranged orthogonally to the sub-lines through switching means, and control lines for supplying control signals to the switching means are arranged from common decoder and driver to memory arrays. In this memory, capacitance of each of the sub-lines through which signals of the memory cells are first read are reduced, but a load capacitance of the second data line is large because a number of transistors associated with the plurality of switching means are connected to the second data line. Therefore, the S/N ratio and the operating speed are limited.

It is an object of the present invention to provide a high integration density, high operating speed and high S/N ratio semiconductor memory.

It is another object of the present invention to provide a semiconductor memory having a reduced capacitance of a second data line.

In accordance with the present invention, there is provided a monolithic semiconductor memory comprising a plurality of word lines adapted to be selectively driven by an address signal, a plurality of first word lines arranged to cross the word lines and divided lengthwise, a plurality of memory cells arranged at crosspoints of the word lines and the first data lines and adapted to be coupled to the corresponding first data lines when the corresponding word lines are driven, a plurality of second data lines one for each of predetermined groups of the first data lines for exchanging data with selected ones of the first data lines through first switching means, third data lines arranged orthogonally to the second data lines for exchanging data with selected ones of the second data line through second switching means, and a read/write control circuit associated with the third data lines.

In the drawings:

FIGS. 3 to 13 are circuit diagrams of other embodiments of the present invention.

Figure 1:
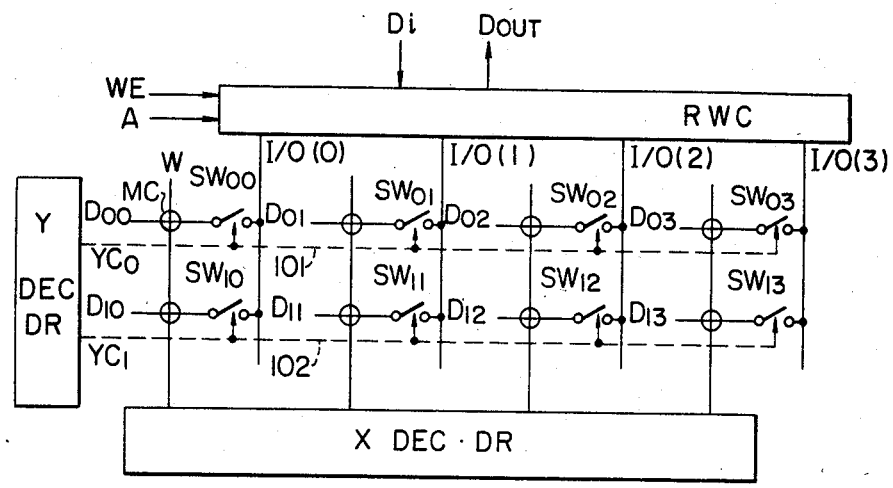
FIG. 1 is a circuit diagram of a memory disclosed in a prior U.S. application Ser. No. 380,409 filed by the inventors of the present application on May 20, 1982.

Prior to the description of the embodiments of the present invention, the memory disclosed in the prior U.S. Patent Application Ser. No. 380,409 will be explained with reference to FIG. 1. In this memory, each of first data lines is divided into a plurality of sub-lines $D_{00}$, $D_{01}$, $D_{02}$ and $D_{03}$ or $D_{10}$, $D_{11}$, $D_{12}$ and $D_{13}$, and data is exchanged between the sub-lines and second data lines $I/O(0)$, $I/O(1)$, $I/O(2)$ and $I/O(3)$ through switches $SW_{00}$, $SW_{01}$, $SW_{02}$, $SW_{03}$, $SW_{10}$, $SW_{11}$, $SW_{12}$ and $SW_{13}$. W denotes a word line, XDEC.DR and YDEC.DR denote X-decoder/driver and Y-decoder/driver, RWC denotes a read/write controller, MC denotes a memory cell, WE denotes a write enable signal, $D_i$ denotes an input data and $D_{out}$ denotes an output data. Numerals 101 and 102 denote control lines to which signals $YC_0$ and $YC_1$ for controlling the switches $SW_{01}$...$SW_{13}$ are applied. In this memory, because the first data lines are divided, load capacitances thereof as viewed from the memory cells are reduced and a high S/N ratio or a high operation speed is attained. However, since a number of transistors associated with a number of switches are connected to the second data lines $I/O(0)$, $I/O(1)$, $I/O(2)$ and $I/O(3)$, load capacitances of the second data lines increase and the S/N ratio and the operation speed are limited.

Figure 2:
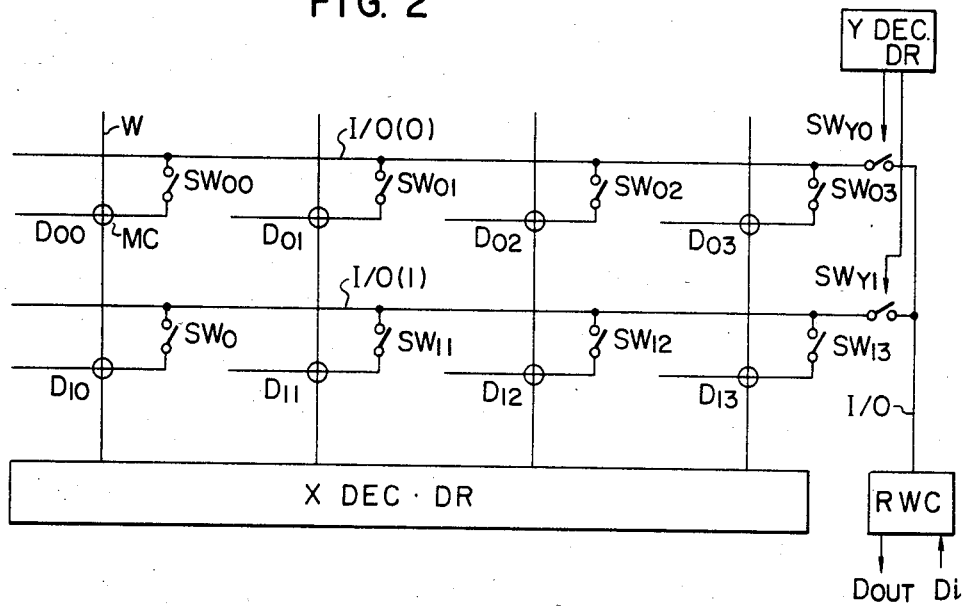
FIG. 2 is a circuit diagram of one embodiment of the present invention.

FIG. 2 is a conceptual view of one embodiment of the present invention. In the present embodiment, the second data lines $I/O(0)$ and $I/O(1)$ are arranged in parallel to the sub-lines $D_{00}$, $D_{01}$, $D_{02}$ and $D_{03}$ of the first data line. W denotes a word line, XDEC.DR denotes an X-decoder/driver, YDEC.DR denotes a Y-decoder/driver, RWC denotes a read/write controller, MC denotes a memory cell, WE denotes a write enable signal, $D_i$ denotes an input data and $D_{out}$ denotes an output data. In the present embodiment, the load capacitances of the second data lines $I/O(0)$ and $I/O(1)$ are much smaller than those of FIG. 1 because a small number of transistors associated with a small number of switches one for each of the sub-lines of the first data lines are connected to the second data lines. Signals picked up from the second data lines $I/O(0)$ and $I/O(1)$ through the switches $SW_{00}$ and $SW_{01}$ are supplied to a third data line I/O through a selected one of switches $SW_{Y0}$ and $SW_{Y1}$ which are controlled by the Y-decoder YDEC, and outputted from the read/write controller RWC as the output data $D_{out}$.

FIG. 3 shows a detail of the embodiment of FIG. 2. In FIG. 3, a sense amplifier $SA_1$ is connected to each of the sub-lines $D_{00}$, $D_{01}$, $D_{02}$, $D_{03}$, $D_{10}$, $D_{11}$, $D_{12}$ and $D_{13}$ of the first data lines, a sense amplifier $SA_2$ is connected to each of the second data lines $I/O(0)$ and $I/O(1)$, and a sense amplifier $SA_3$ is connected to the third data line. The switches for connecting the first data lines and the second data lines are controlled by the Y-decoder YDEC through control lines 201, 202, 203 and 204, and the switches for connecting the second data lines and the third data line are controlled by the Y-decoder through control lines 301 and 302. By providing the sense amplifiers to the respective stages of the first, second and third data lines, the signals on the respective data lines can be amplified at a high speed. The sense amplifiers in each one of these stages may be omitted. While the switches for connecting the first, second and third data lines are controlled by the Y-address signals in the illustrated embodiment, they may be controlled by the X-address signals or logical AND functions of the X-address signals and the Y-address signals depending on the structure of the memory array.

FIG. 4 shows a modification of FIG. 2 in which the data lines are paired. The first data lines comprise sub-line pairs $D_{01}$ and $\overline{D_{01}}$, $D_{02}$ and $\overline{D_{02}}$, $D_{03}$ and $\overline{D_{03}}$, $D_{10}$ and $\overline{D_{10}}$, $D_{11}$ and $\overline{D_{11}}$, $D_{12}$ and $\overline{D_{12}}$, and $D_{13}$ and $\overline{D_{13}}$, and a differential sense amplifier $SA_1$ is connected to each pair. The second data lines comprise pairs of data lines I/O(0) and $\overline{I/O(0)}$, and I/O(1) and $\overline{I/O(1)}$ and a differential sense amplifier $SA_2$ is connected to each pair. The third data lines also comprises a pair of data lines I/O and $\overline{I/O}$ and a differential sense amplifier $SA_3$ is connected thereto. A memory cell MC is located at each of crosspoints of the first data line sub-line pairs and the word lines W. The memory cell may be constructed as shown in FIG. 5, FIG. 6 or FIG. 7.

FIG. 5 shows a flip-flop type memory cell used in a static RAM. FIG. 6 shows a twin memory cell disclosed in the U.K. Pat. No. 1,502,334 (International Business Machine Corporation) and FIG. 7 shows a memory cell disclosed in U.S. Pat. No. 4,044,430 issued to Kiyoo Itoh on Aug. 23, 1977.

Figure 8:
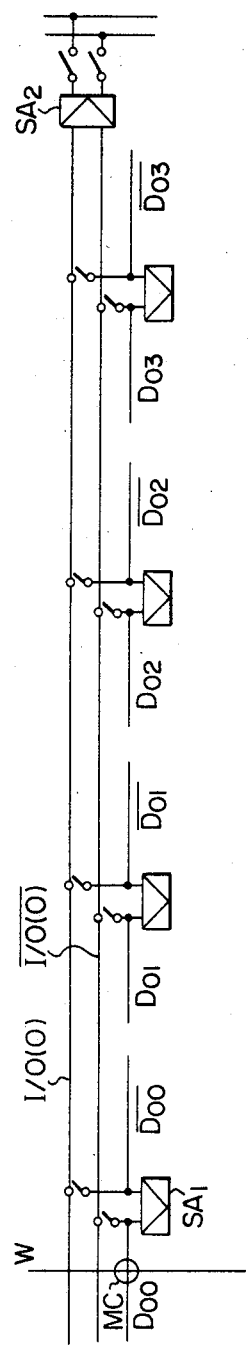

FIG. 8 shows an embodiment of the present invention as applied to the memory cell (open bit line cell) which is referred to as prior art in the U.S. Pat. No. 4,044,430.

Figure 9:
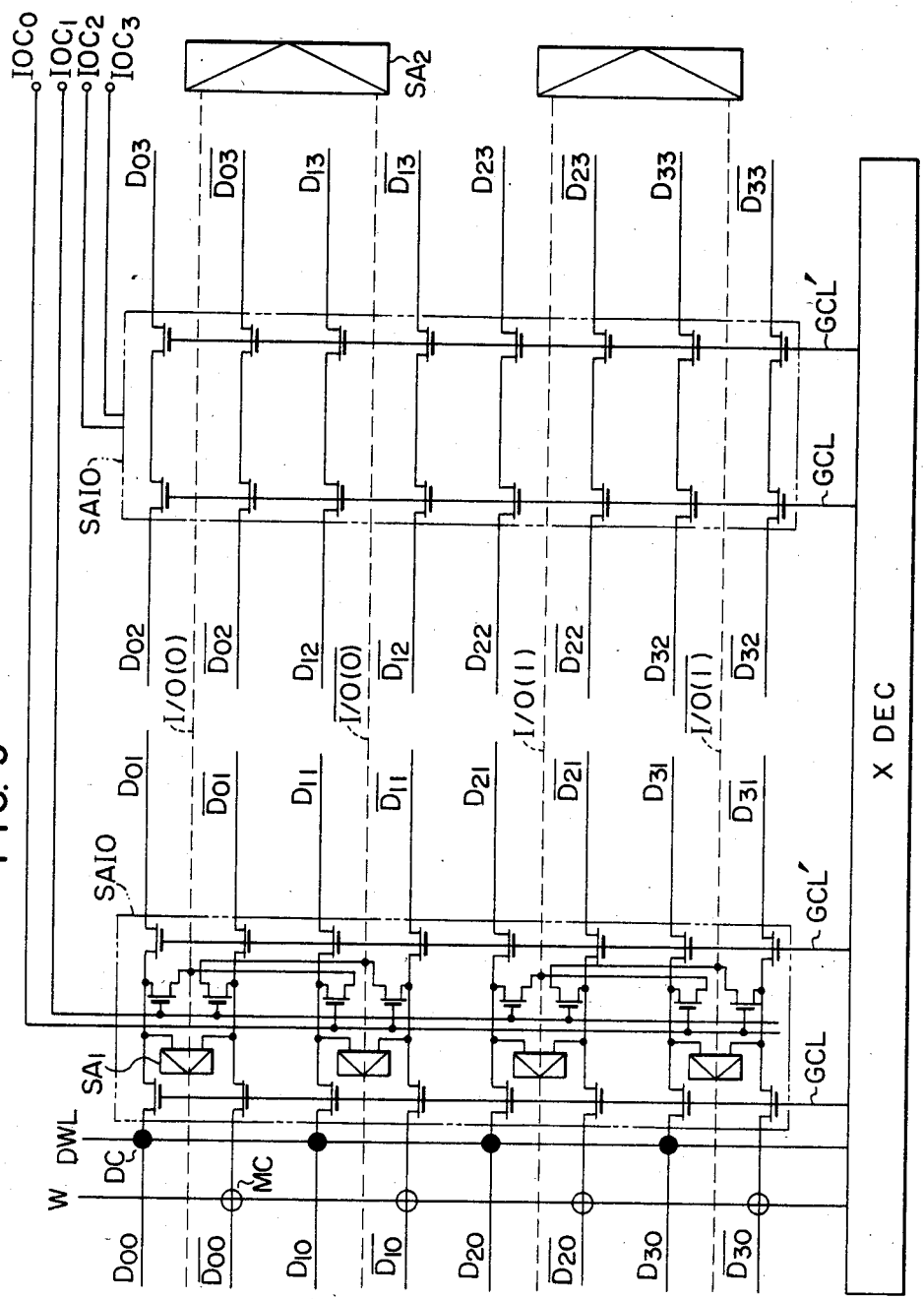

FIG. 9 shows a specific embodiment of FIG. 3 in which each bit cell comprises one transistor and one capacitor. The operation is as follows.

When the word line W is selected, small read signals are supplied from the respective cells MC to the data lines $\overline{D_{00}}$, $\overline{D_{10}}$, $\overline{D_{20}}$ and $\overline{D_{30}}$ connected to the memory cells MC. A pulse voltage is applied to a dummy word line DWL and signals of an intermediate level between "1" and "0" output signals from the memory cells MC are supplied from respective dummy cells DC to the data lines $D_{00}$, $D_{10}$, $D_{20}$ and $D_{30}$ connected to the dummy cells DC. The output signals from the data line pairs $D_{00}$ and $\overline{D_{00}}$ and so on are supplied to the sense amplifiers $SA_1$ through a data line GCL and differentially amplified by the sense amplifiers $SA_1$. The amplified signals are selected by an address signal which turns on one of signals $IOC_0$ and $IOC_1$ and the selected signals are supplied to the sense amplifiers $SA_2$. For example, when the signal $IOC_0$ is turned on, the signals on the line pairs $D_{10}$ and $\overline{D_{10}}$, and $D_{30}$ and $\overline{D_{30}}$ are supplied to the corresponding sense amplifiers $SA_2$. When the signal $IOC_1$ is turned on, the signals on the line pairs $D_{00}$ and $\overline{D_{00}}$, and $D_{20}$ and $\overline{D_{20}}$ are supplied to the corresponding sense amplifiers $SA_2$. In the present embodiment, the signals $IOC_0$ and $IOC_1$ are decoded in order to attain a large wiring pitch of the paired lines I/O(0) and $\overline{I/O(0)}$, and $\overline{I/O(1)}$ and I/O(1). The present embodiment is effective when the paired lines I/O(0) and $\overline{I/O(0)}$ and so on are formed on a second Al layer as disclosed in U.S. patent application Ser. No. 380,409, in which, however, it was difficult to attain a large wiring pitch. A circuit SAIO (detail of which is not shown for a sake of simplicity) which is controlled by signals $IOC_2$ and $IOC_3$ operates in the same manner.

Figure 10:
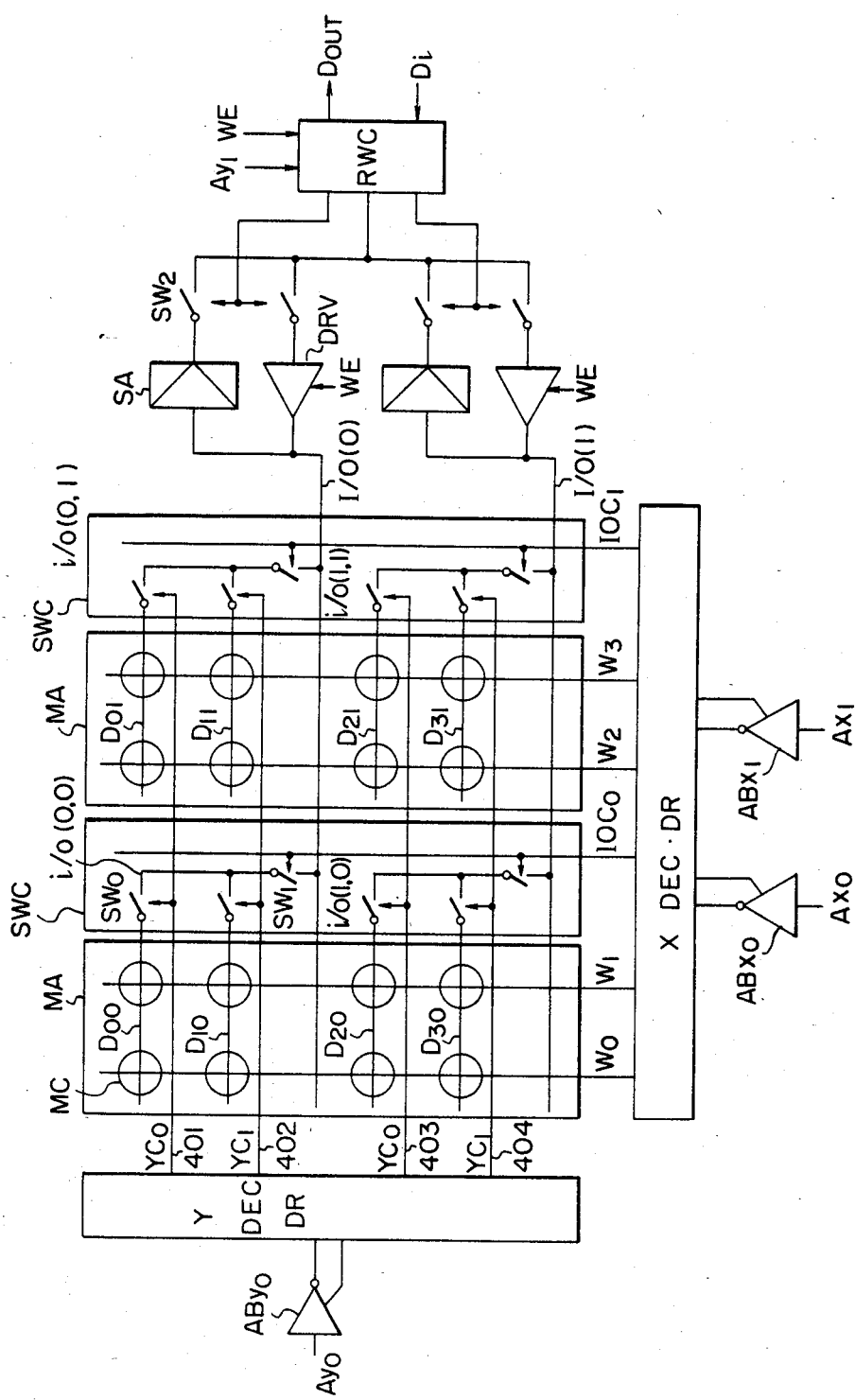

FIG. 10 shows another embodiment of the present invention. For a sake of easiness of understanding, a memory having eight rows and eight columns is shown. A memory cell MC is located at each of crosspoints of first data lines $D_{00}$, $D_{01}$, $D_{10}$, $D_{11}$, $D_{20}$, $D_{21}$, $D_{30}$ and $D_{31}$ which are divided lengthwise into two sub-lines and word lines $W_0$, $W_1$, $W_2$ and $W_3$. Second data lines I/O (0, 0) i/o(0,1), i/o(1,0) and i/o(1,1) are arranged orthogonally to the first data lines one for each a plurality of parallel first data lines, that is, two first data lines in FIG. 10, and the second data lines and the first data lines are connected through first switches $SW_0$ which are controlled by control lines 401, 402, 403 and 404, respectively. Third data lines I/O(0) and I/O(1) are arranged orthogonally to the second data lines or parallelly to the first data lines one for each parallel group of the second data lines. The third data lines and the second data lines are connected through second switches $SW_1$ which are controlled by control lines $IOC_0$ and $IOC_1$ respectively. A sense amplifier SA and a driver DRV are connected to each of the third data lines I/O(0) and I/O(1). The sense amplifiers SA and the drivers DRV are connected to a read/write controller RWC through third switches $SW_2$. $A_{y1}$ denotes a Y-address signal for selecting one of two channels of the sense amplifier and the driver, WE denotes a write enable signal, $D_{out}$ denotes a memory output signal and $D_i$ denotes an input signal. $AB_{y0}$ denotes an address buffer to which a Y-address signal $A_{y0}$ is applied, and $AB_{x0}$ and $AB_{x1}$ denote address buffers to which X-address signals $A_{x0}$ and $A_{x1}$ are applied, respectively.

When the word line $W_0$ is on and the signal $YC_0$ of the control signals outputted by the YDEC.DR to the control lines 401, 402, 403 and 404 is on, the memory of FIG. 10 operates in the following manner. When $W_0$ is on and $YC_0$ of the signals on the data lines $D_{00}$, $D_{10}$, $D_{20}$ and $D_{30}$ is on, the switch $SW_0$ is actuated so that only the signals $D_{00}$ and $D_{20}$ are supplied to the i/o(0,0) and i/o(1,0). The $IOC_0$ controlled by the XDEC.DR is turned on and the data thereof are supplied to the I/O(0) and I/O(1). The data are amplified by the sense amplifiers SA and a desired data is selected by the third switch $SW_2$ to provide the output data. A write operation is carried out by the input data $D_i$ and the write enable signal WE through the RWC and the DRV.

In the embodiment of FIG. 10, the second data lines are divided lengthwise into i/o(0,0), i/o(1,0) and so on. Alternatively, the second data lines may be continuous and the third data line may be common to the entire memory array. In this case, the third switch $SW_2$ is not necessary and only one of the four control lines 401, 402, 403 and 404 is selected by the Y-address signals $A_{y0}$ and $A_{y1}$. Thus, the address buffer $AB_{y0}$ as well as an address buffer to which the address signal $A_{y1}$ is applied are connected to the YDEC.DR. In this case, the load capacitances of the respective second data lines increase but the numbers of the third data lines and the sense amplifiers and the drivers associated to the third data lines are halved.

Alternatively, a plurality of sets of the third data lines I/O(0) and I/O(1) and the associated sense amplifiers SA and drivers WE may be provided and the third switches may be omitted so that a plurality of data are parallelly read and written by the respective sets of the sense amplifiers and the drivers. This configuration is convenient when the LSI memory of a multi-bit configuration is used.

The memory cells MC of FIG. 10 may be one of various alternatives. By pairing the first, second and third data lines of FIG. 10, the memory cells shown in FIGS. 5 to 7 may be used.

A dynamic memory cell comprising one MOS transistor and one capacitor will be explained below.

Figure 11:
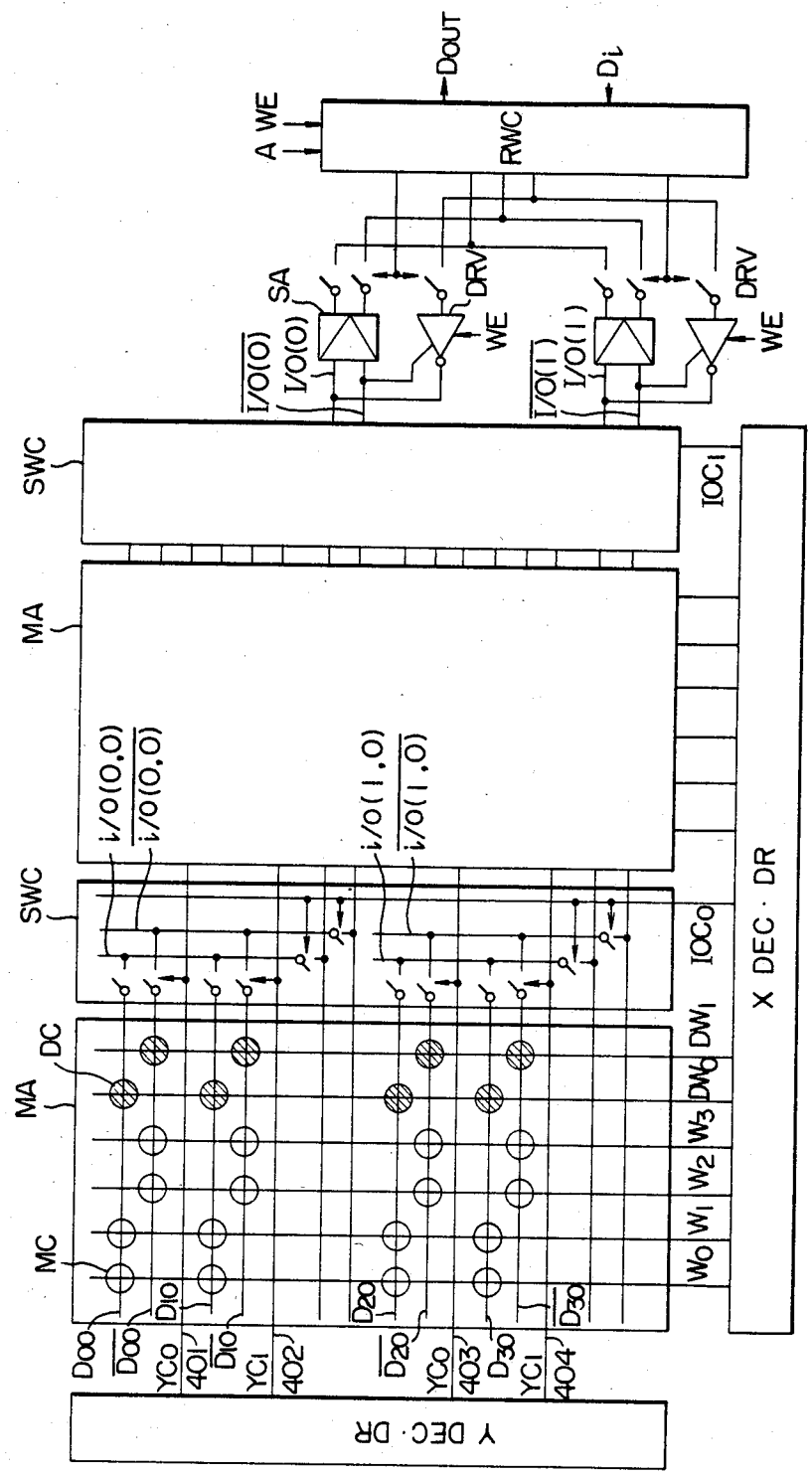

FIG. 11 shows another embodiment of the semiconductor memory of the present invention, in which a memory cell having a folded data line disclosed in U.S. Pat. No. 4,044,430 is used and the data line is divided into two sub-lines. Address buffers are connected to Y decoder/driver Y DEC.DR and X decoder/driver X DEC.DR. However, these address buffers may be omitted in FIG. 11 for a sake of simplification. Precharge circuits and sense amplifiers are connected to first data line pairs $D_{00}$, $\overline{D_{00}}$, $D_{10}$, $\overline{D_{10}}$, $D_{20}$, $\overline{D_{20}}$, and $D_{30}$, $\overline{D_{30}}$ or second data line pairs i/o(0,0), $\overline{i/o(0,0)}$ and i/o(1,0), $\overline{i/o(1,0)}$ as required. However these precharge circuits and sense amplifiers may be also omitted in FIG. 11. MC denotes the memory cell, and DC denotes a dummy cell which produces a reference voltage to a read signal of the memory cell MC. This reference signal is differentially amplified by the sense amplifier to discriminate information "1" and "0". Signals from selected first data line pairs are applied to the second data line pairs, and signals from selected second data line pairs are applied to third data line pairs I/O(0), $\overline{I/O(0)}$, and I/O(1), $\overline{I/O(1)}$. $W_0$, $W_1$, ... denote word lines, $DW_0$ and $DW_1$ denote dummy word lines and $IOC_0$ and $IOC_1$ denote switch control signals. SWC denotes a switching controller and MA denotes a memory cell array.

In the present embodiment, the first data line pairs $D_{00}$ and $\overline{D_{00}}$, $D_{10}$ and $\overline{D_{10}}$, $D_{20}$ and $\overline{D_{20}}$, and $D_{30}$ and $\overline{D_{30}}$ are formed on a first Al layer, and the control lines 401, 402, 403 and 404 (hereinafter referred to as YC lines) to which the switch control signals $YC_0$ and $YC_1$ are applied are formed on a second Al layer, although the present invention is not limited thereto. In a memory in which the data lines are formed on a material other than Al such as poly-Si, the YC lines need not be formed on the second Al layer but they may be formed on the first Al layer.

Figure 12:
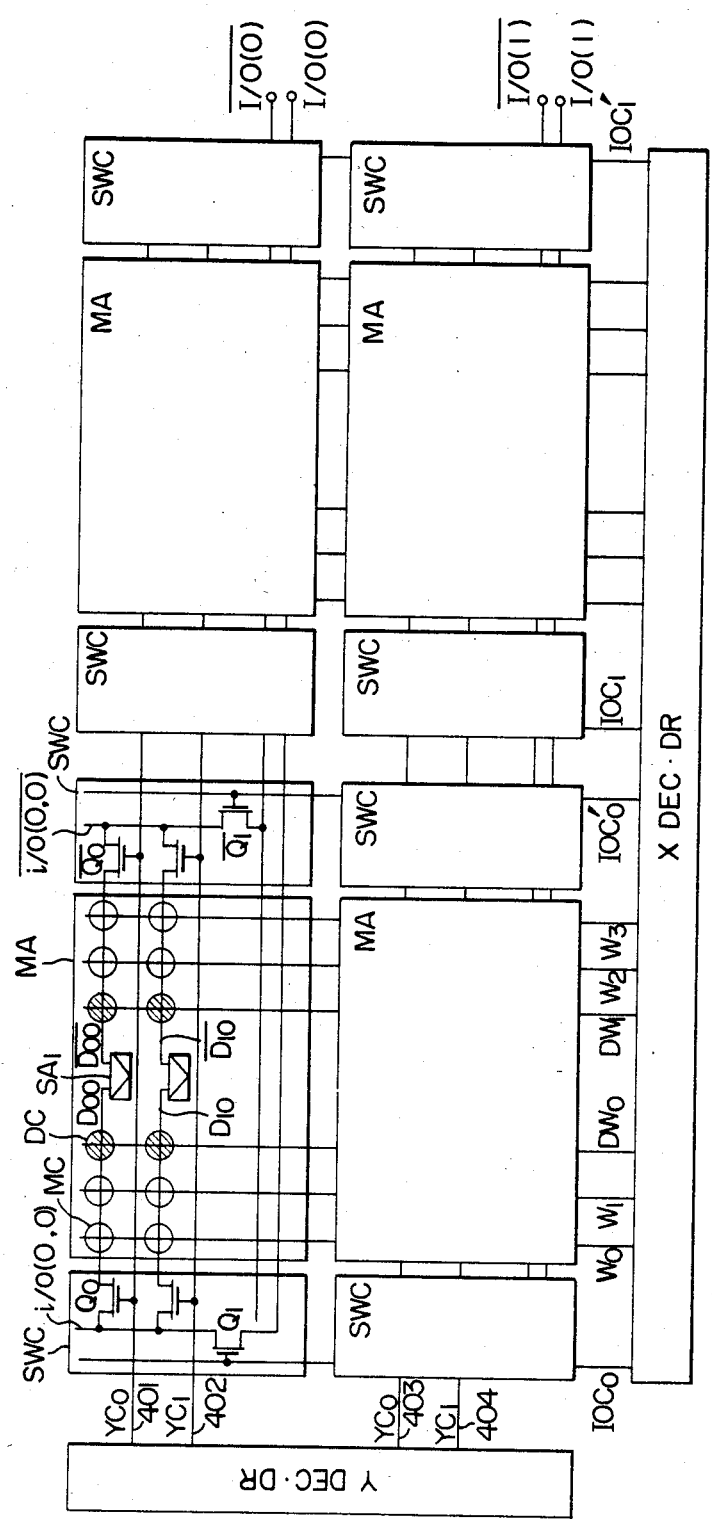

FIG. 12 shows another embodiment of the semiconductor memory of the present invention. Switching transistors Q and $\overline{Q}$ are arranged at opposite ends of the data line pairs $D_{00}$ and $\overline{D_{00}}$ and so on, and gates of the transistors are controlled by $YC_0$ and so on. Switching transistors $Q_1$ and $\overline{Q_1}$ controlled by $IOC_0$, $IOC'_0$, and so on are arranged at ends of the second data lines i/o(0,0), $\overline{i/o(0,0)}$ and so on. The transistors $Q_0$ and $\overline{Q_0}$ may be arranged in the proximity of the sense amplifiers $A_1$. In this case, however, the layout is complex and the capacitances of the data line pairs are unbalanced, which results in a noise or the increase of the data line capacitances. In the embodiment of FIG. 12, the layout can be designed independently of the sense amplifiers $SA_1$. The memory cell may have the data lines formed on a three-layer poly-Si as shown in NIKKEI ELECTRONICS, Aug. 30, 1982, page 166, FIG. 10.

The control lines $IOC_0$, $IOC_1$ in FIG. 10 and FIG. 11 and the control lines $IOC_0$, $IOC'_0$, $IOC_1$, $IOC'_1$ in FIG. 12 are all selected and driven by Y address signal in each illustrated embodiment. However, these control lines may be selected and driven by Y address signal or logical AND functions of the X address signal and address signal depending on the structure of the memory array.

Figure 13:
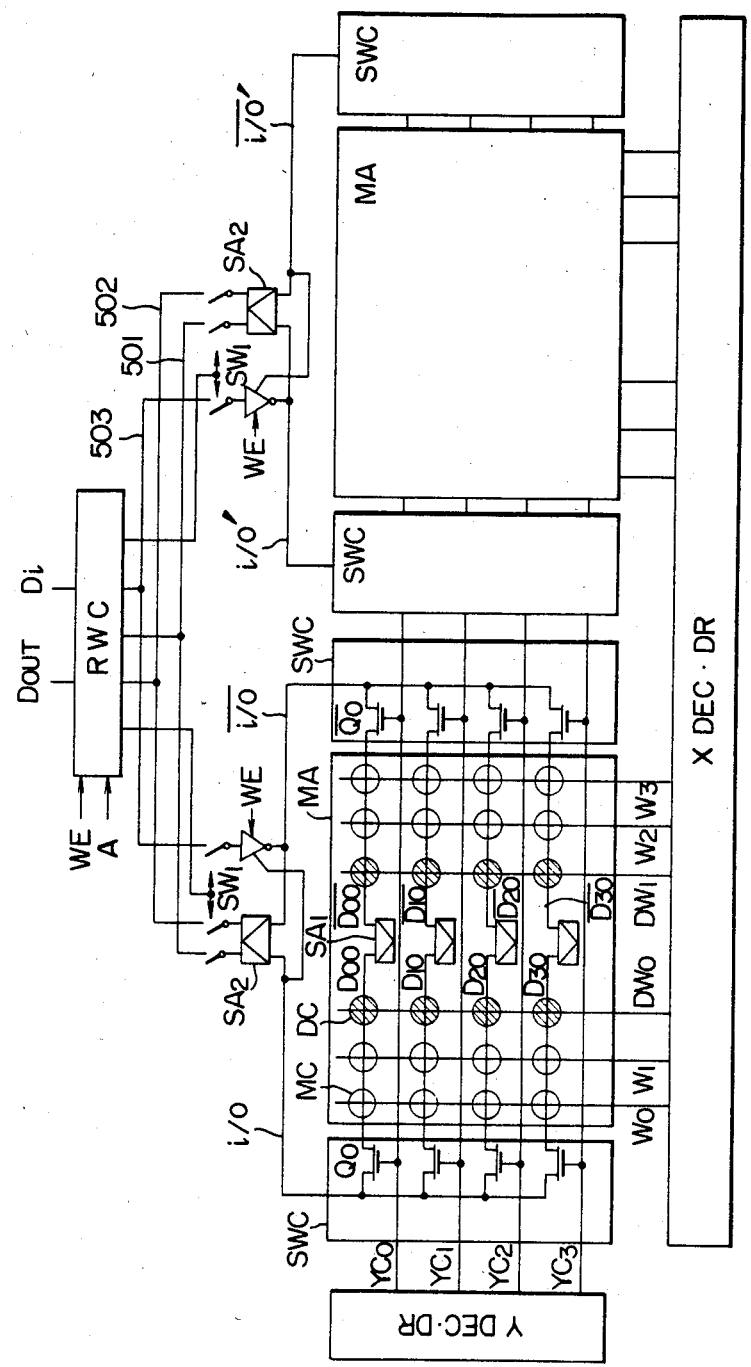

FIG. 13 shows a further embodiment of the semiconductor memory of the present invention, in which the configuration of FIG. 12 having the switches arranged at the ends of the data line pairs are used and the second data lines i/o, $\overline{i/o}$, i/o' and $\overline{i/o'}$ are arranged orthogonally to the first data lines $D_{00}$, $\overline{D_{00}}$, $D_{10}$, $\overline{D_{10}}$, $D_{20}$, $\overline{D_{20}}$, $D_{30}$ and $\overline{D_{30}}$. Each of the first data line is connected to one of the second data line through a switch composed of MOS transistor $Q_0$ or $\overline{Q_0}$. Each pair of the second data lines i/o and $\overline{i/o}$ or i/o' and $\overline{i/o'}$ is provided with a sense amplifier $SA_2$ and driver WE. Data from read/write controller RWC are applied to a data line 503 and applied to one of the driver WE which is selected by switch $SW_1$. Data from one of the second data line pairs i/o and $\overline{i/o}$ or i/o' and $\overline{i/o'}$ are selected by switch $SW_1$ and applied to data lines 501 and 502. The data lines 501, 502 and 503 constitute third data lines. In the present embodiment, the capacitances of the second data lines are somewhat larger but a space required is smaller and the design is facilitated because of the simple circuit. A specific circuit configuration arranged on a chip will be explained below.

Figure 14:
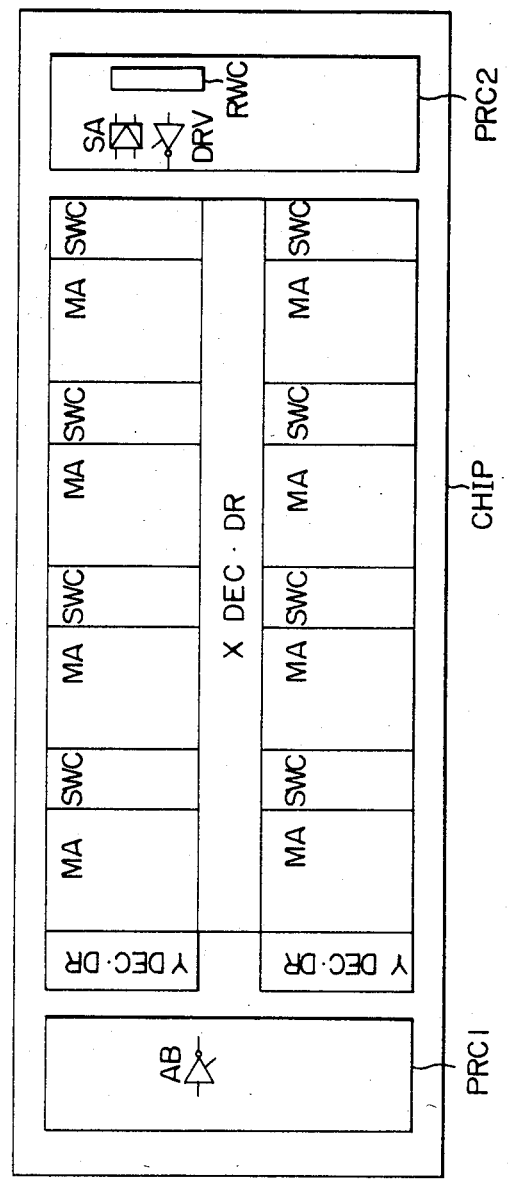
FIG. 14 and 15 are plan views showing chip layouts in the present invention.

FIG. 14 shows a layout for the memory arrays MA symmetrically arranged to the X DEC.DR of FIG. 11. The word lines of the memory having the folded data lines are usually made of poly-Si of relatively high resistance, refractory metal or metal silicide. If the chip shape must be rectangular as shown in FIG. 14 because of a limitation by a package dimension, it is desirable to arrange the word lines along the shorter side of the chip and they are driven at the center divided points of the word lines in order to shorten the delay time of the word lines. If the YC lines are made of wiring material of sufficiently low resistance such as Al, they may be arranged along the longer side of the chip to extend through a plurality of memory arrays MA. It is advantageous to arrange the sense amplifiers SA and the drivers DR connected to the I/O lines in an area of peripheral circuits PRC2 opposite to the YDEC.DR in order to facilitate the layout design. If they are arranged in an area of peripheral circuits PRC1, the wirings to the SA and DRV must pass over the YDEC.DR, which makes the layout design difficult. FIG. 14 may be applied to the embodiment of FIG. 12, but the word lines need not be divided because the word lines of the one-crosspoint cell are made of low resistance material such as Al, and the XDEC.DR may be arranged at the end of the shorter side of the chip.

Figure 15:
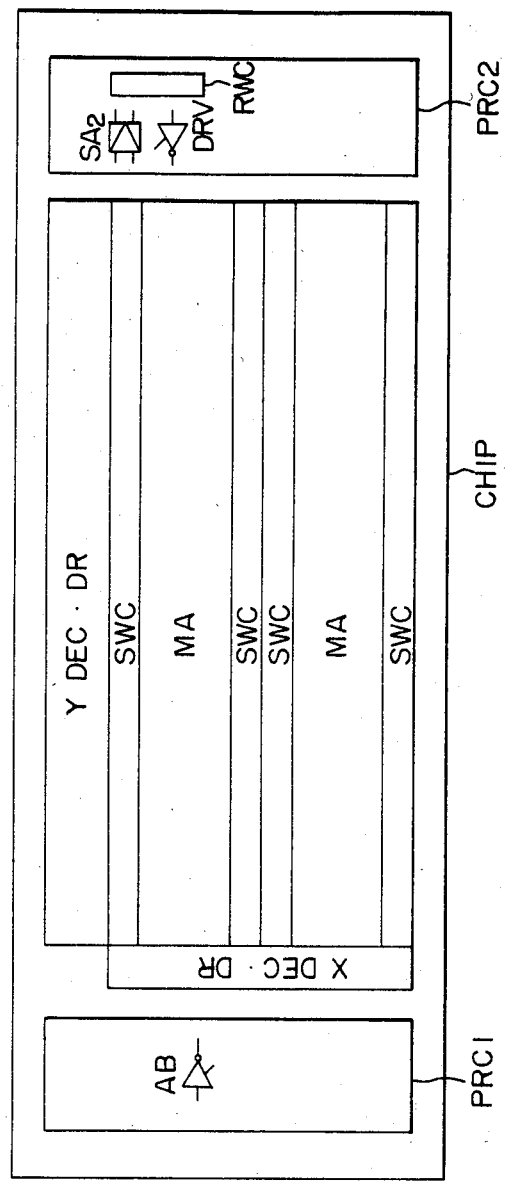

FIG. 15 shows a layout of the embodiment of FIG. 13. Since the word lines are arranged along the longer side of the chip, the advantage of low resistance of the one-crosspoint cell is effectively utilized. By forming the YC lines on the second Al layer, the YDEC.DR can be arranged at the end of the chip as shown in FIG. 15 and the driver of the YDEC.DR need be arranged on only one side. Accordingly, a space required is reduced. The YDEC.DR may be arranged at a center depending on a design requirement.

We claim:

1. A monolithic semiconductor memory comprising:
    a plurality of word lines adapted to be selectively driven by an address signal;
    a plurality of first data lines each arranged to cross said word lines and divided lengthwise;
    a plurality of memory cells each arranged at each of crosspoints of said word lines and said first data lines and adapted to be coupled to a corresponding one of said first data lines when a corresponding one of said word lines is driven;
    a plurality of second data lines each arranged for each of predetermined groups of said first data lines for exchanging data with selected ones of said first data lines through first switching means;

a one or more third data lines arranged orthogonally to said second data lines for exchanging data with selected ones of said second data lines through second switching means; and read/write control means associated with said third data lines.

2. A monolithic semiconductor memory according to claim 1 wherein sense amplifiers are connected to any or all of said first, second and third data lines.

3. A monolithic semiconductor memory according to claim 1 wherein said first, second and third data lines are paired.

4. A monolithic semiconductor memory according to claim 3 wherein differential sense amplifiers are connected to any or all of said first, second and third data lines.

5. A monolithic semiconductor memory according to claim 1 wherein said second data lines are arranged in parallel to said first data lines.

6. A monolithic semiconductor memory according to claim 5 wherein control lines carrying signals to control said first switching means are arranged orthogonally to said first data lines.

7. A monolithic semiconductor memory according to claim 1 wherein said second data lines are arranged orthogonally to said first data lines.

8. A monolithic semiconductor memory according to claim 7 wherein control lines carrying signals to control said first switching means are arranged in parallel to said first data lines.

9. A monolithic semiconductor memory according to claim 7 wherein said second data lines are provided one for each of predetermined groups of parallelly arranged ones of said first data lines, and said third data lines are provided one for each of predetermined groups of parallelly arranged ones of said second data lines.

10. A monolithic semiconductor memory according to claim 9 wherein said third data lines are connected to said read/write control means through third switching means.

11. A monolithic semiconductor memory according to claim 7, wherein each of said second data lines is arranged to be adjacent to a first data line and is coupled to a plurality of respective divided sections of the first data line it is adjacent to.

* * * * *